United States Patent [19]
Tanaka

[11] Patent Number: 5,677,876
[45] Date of Patent: Oct. 14, 1997

[54] FLASH EEPROM WITH IMPURITY DIFFUSED LAYER IN CHANNEL AREA AND PROCESS OF PRODUCTION OF SAME

[75] Inventor: Akira Tanaka, Kanagawa, Japan

[73] Assignee: Sony Corporation, Japan

[21] Appl. No.: 593,369

[22] Filed: Jan. 29, 1996

[30] Foreign Application Priority Data

Jan. 30, 1995 [JP] Japan ................................. 7-013110

[51] Int. Cl.$^6$ ................................................. H01L 29/68
[52] U.S. Cl. .......................... 365/185.28; 365/185.29; 257/315; 257/316; 257/317
[58] Field of Search .......................... 365/185.28, 185.29, 365/185.24, 185.15; 257/315, 316, 317, 318

[56] References Cited

U.S. PATENT DOCUMENTS

| | | | |
|---|---|---|---|
| 5,274,588 | 12/1993 | Manzur et al. | 257/316 |
| 5,488,245 | 1/1996 | Shimizu et al. | 257/316 |

FOREIGN PATENT DOCUMENTS

| | | | |
|---|---|---|---|
| 4179273 | 6/1992 | Japan | 257/316 |
| 5110108 | 4/1993 | Japan | 257/316 |

Primary Examiner—David C. Nelms
Assistant Examiner—Vu A. Le
Attorney, Agent, or Firm—Ronald P. Kananen

[57] ABSTRACT

A nonvolatile semiconductor memory device having a plurality of memory cells, each memory cell comprising a semiconductor substrate having a first conductivity, a first impurity region having a second conductivity, a second impurity region having the second conductivity, said first and second impurity regions being formed separated from each other in a surface area of the semiconductor substrate, a channel region formed between the pair of impurity regions in the surface area of the semiconductor substrate, a floating gate electrode formed on the channel region via a tunneling insulation layer, and a control gate electrode formed on the floating gate electrode via a dielectric layer, the channel region having formed in it an impurity diffused layer having the second conductivity to thereby reduce a leakage current flowing between the first impurity region and the semiconductor substrate when extracting electrons from the floating gate and the leakage current between the second impurity region and the semiconductor substrate when injecting electrons to the floating gate.

12 Claims, 4 Drawing Sheets

IMPURITY CONCENTRATION OF
N TYPE DIFFUSED REGION FOR
REDUCING SUBSTRATE CURRENT (cm$^{-3}$)

FLASH EEPROM WITH IMPURITY DIFFUSED LAYER IN CHANNEL AREA AND PROCESS OF PRODUCTION OF SAME

BACKGROUND OF THE INVENTION

1. Field of the Invention

The present invention relates to a semiconductor memory with a floating gate, more particularly to an electrically programmable flash electrically erasable and programmable read only memory (EEPROM), and to a process for production of such a flash EEPROM.

2. Description of the Related Art

In recent years, there has been active development of EEPROMs. In particular, there is known a method of using an N-type flash EEPROM and removing the charge accumulated in the floating gate to a source region.

In this method, data is erased by supplying the source electrode of the memory cell of the EEPROM with a higher voltage than the control electrode to move the electrons on the floating gate to the source electrode by the resultant tunneling phenomenon.

However, when extracting electrons from a floating gate to a source electrode, a large current called a "band-to-band current" is caused between the source region and the substrate, so this method requires another high voltage-high current power source in addition for writing data to the flash EEPROM.

To reduce this band-to-band current, in the related art, the impurity concentration of the source region has been set low. This method can reduce the band-to-band current, but has the disadvantage that the flow of electrons from the floating gate to the source region is reduced, which has an undesirable effect on the characteristics of the semiconductor device.

SUMMARY OF THE INVENTION

The present invention was made to solve the above problem and has as an object to provide a nonvolatile semiconductor memory which can reduce the substrate current when injecting electrons to a floating gate or extracting electrons from a floating gate.

According to the present invention, there is provided a nonvolatile semiconductor memory device having a plurality of memory cells, each memory cell comprising a semiconductor substrate having a first conductivity, a first impurity region having a second conductivity, a second impurity region having the second conductivity, said first and second impurity regions being formed separated from each other in a surface area of the semiconductor substrate, a channel region formed between the pair of impurity regions in the surface area of the semiconductor substrate, a floating gate electrode formed on the channel region via a tunneling insulation layer, and a control gate electrode formed on the floating gate electrode via a dielectric layer, the channel region having formed in it an impurity diffused layer having the second conductivity to thereby reduce a leakage current flowing between the first impurity region and the semiconductor substrate when extracting electrons from the floating gate and the leakage current between the second impurity region and the semiconductor substrate when injecting electrons to the floating gate.

Preferably the impurity concentration of the impurity diffused region for reducing the substrate current is lower than that of the source region and drain region.

Preferably the impurity concentration of the impurity diffused layer is from $1\times10^{16}$ cm$^{-3}$ to $1\times10^{18}$ cm$^{-3}$.

Further, preferably the injection of electrons to the floating gate and the extraction of electrons from the floating gate are performed by the tunneling current.

BRIEF DESCRIPTION OF THE DRAWINGS

These and other objects and features of the present invention will become clearer by the following description of the present invention made with reference to the accompanying drawings, in which.

DESCRIPTION OF THE PREFERRED EMBODIMENTS

Before describing the preferred embodiments of the present invention, the related art will be described for background.

The method of extracting electrons from a floating gate will be explained referring to FIGS. 1A, 1B, and 1C taking as an example an N-channel type flash EEPROM.

Figure 1A:
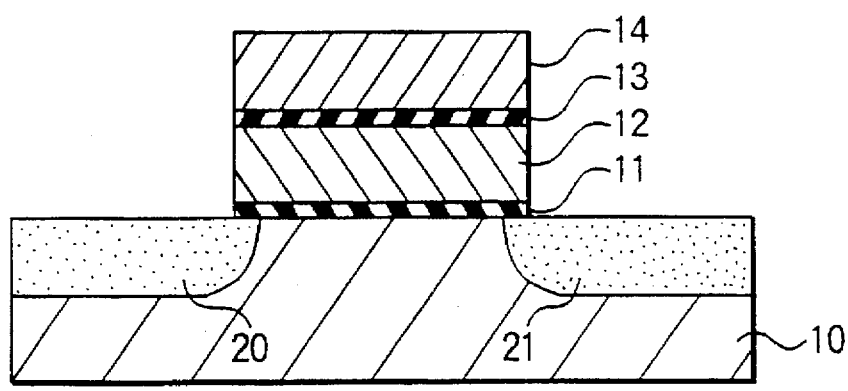
FIG. 1A is a sectional view of a conventional flash EEPROM.

The configuration of the EEPROM shown in FIG. 1A is as follows. A floating gate 12, a second insulating layer 13, and a control gate 14 are successively constructed in order on the surface of a P-type substrate 10 via a first gate insulating layer 11, whereas an N-type source region 20 and N-type drain region 21 are formed beneath the surface of the substrate 10.

Figure 1B:
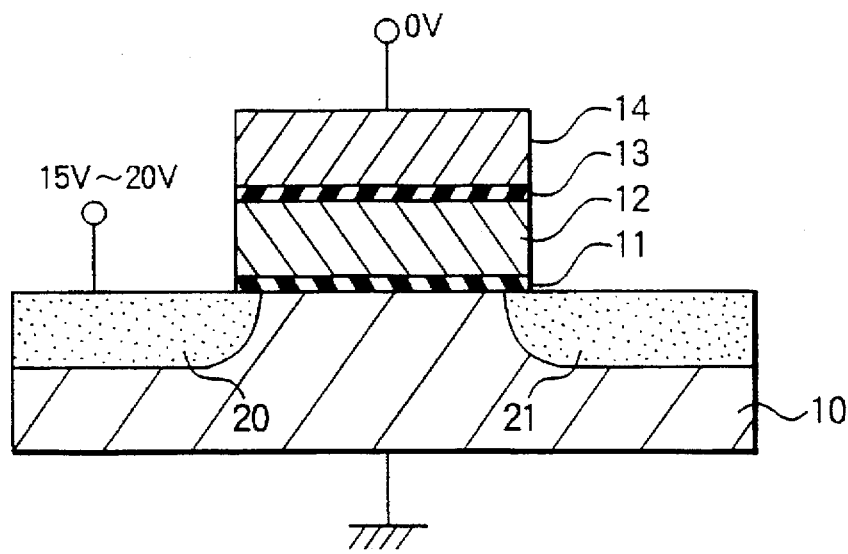
FIG. 1B is a sectional view of a conventional flash EEPROM shown in FIG. 1A showing the bias conditions for erasing.
Figure 1C:
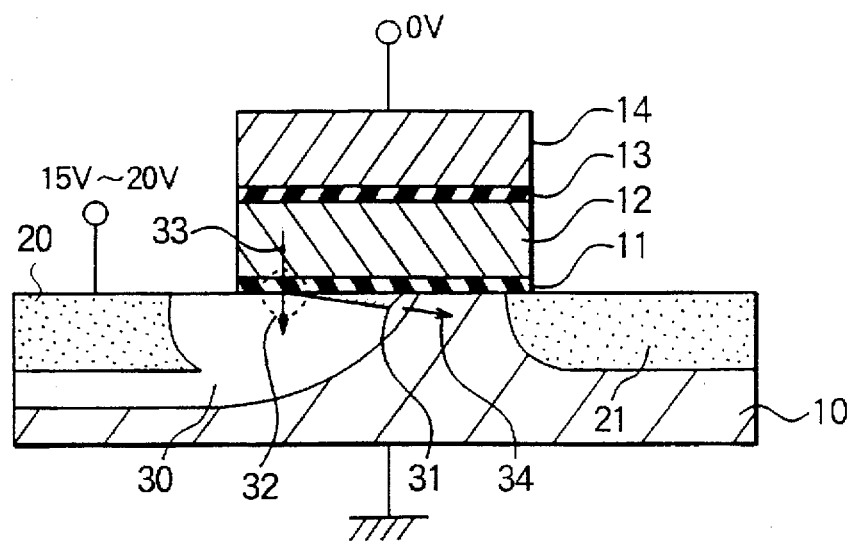
FIG. 1C is a sectional view of the conventional flash EEPROM shown in FIG. 1A showing the state of spread of the depletion layer when supplying voltage to the EEPROM.

As shown in FIG. 1B, to extract electrons from a floating gate 12, one known process is to apply 15 to 20V between a control gate 14 and the source region 20 to create a high electric field of over 10 MV/cm to the first gate insulating layer 11 and move electrons from the floating gate 12 to the source region 20 by the tunneling phenomenon.

When electrons are extracted from a floating gate by this process, however, a current called a band-to-band current flows between the source region 20 and the P-type substrate 10. Accordingly, a large current flows in such a device and the problem occurs that a high voltage-high current power source as well as a normal power source is needed for driving the semiconductor device.

Explaining this in more detail, as shown in FIG. 1B, by applying 15 to 20V between the control gate 14 and the source region 20, a high voltage is also supplied to the source region 20 beneath the first gate insulating layer 11 as well as a high voltage-high electric field being applied to the first gate insulating layer 11. As a result, as shown in FIG. 1C, a depletion layer 30 and a parasitic channel 31 are formed near a boundary between the source region 20 and the substrate 10 under the first gate insulating layer 11. The parasitic channel 31 connects to the substrate 11. In the relatively high concentration area 32 (surrounded by the dotted line, shown in FIG. 1C) of the source region 20 in the parasitic channel 31, electrons and holes are formed by a mechanism called band-to-band transition. The electrons which are formed flow to the source region 20 along the depletion layer 31 as shown by the arrow 33 in FIG. 1C, whereas holes flow from area of the short circuit to the substrate 10 along the parasitic channel 31 as shown by the arrow 34 in FIG. 1C. Therefore, a large current of 0.1 to 1 µA flows between the source region 20 and the substrate 10. This becomes extremely large when the degree of integration of the memory cells becomes larger.

To reduce such a band-to-band current, conventionally the impurity concentration of the source region is optimized. This method can reduce the band-to-band current, but has the disadvantage that the flow of electrons from the floating gate to the source region is reduced and adversely affects the characteristics of the semiconductor device.

Next, a preferred embodiment of the present invention will be described with reference to the drawings.

Figure 2A:
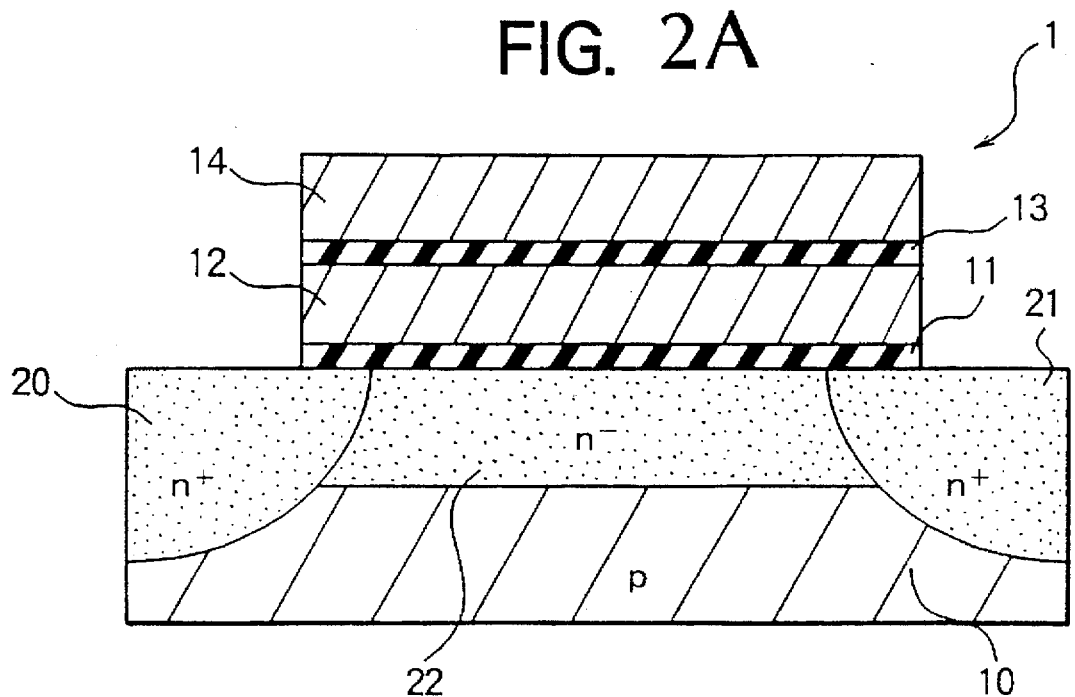
FIG. 2A is a sectional view of the flash EEPROM of the present invention.

The principle of the present invention will be described referring to FIG. 2A. The semiconductor device of the present invention shown in FIG. 2A has, under the first gate insulating layer 11 inside the surface of the P-type substrate 10, an N-type impurity diffused region 22 having an N-type conductivity the same as that of an N-type source region 20 and N-type drain region 21 for reducing the substrate current and functioning as a defense region against leakage current to the substrate. The impurity diffused region 22 for reducing the substrate current connects the source region 20 and the drain region 21 by the same N-type diffusion region under the first gate insulating layer 11.

The rest of the configuration of the semiconductor device 1 of the present invention other than the above configuration is the same as conventional device. That is, a first gate insulating layer 11, a floating gate 12, a second insulating layer 13, and a control gate 14 are successively stacked on the P-type substrate 10.

Figure 2B:
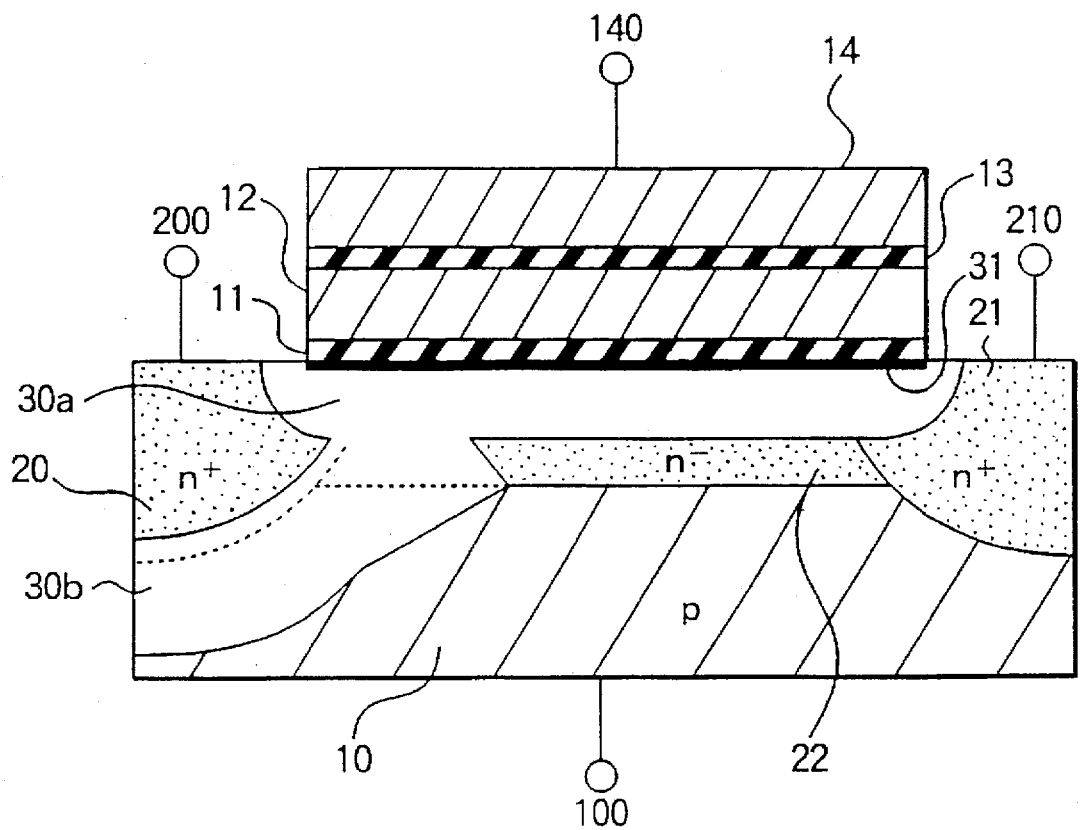
FIG. 2B is a sectional view of the flash EEPROM of the present invention shown in FIG. 2A showing the state of spread of the depletion layer when supplying voltage to the EEPROM.

In the semiconductor device 1 described above, to extract electrons from the floating gate 12, as shown in FIG. 2B, when supplying −10V to the control gate 14 through the control electrode 140, supplying 5V to the source region 20 through a source electrode 200, supplying 0V to the drain region 21 through the drain electrode 210 and supplying 0V to the substrate 10 through a substrate electrode 100 for example, a depletion layer 30a is formed under the first gate insulating layer 11 due to the supply of voltage to the control gate 14 and another depletion layer 30b is formed near the source region 20 due to the supply of voltage to the source 20. The problematical parasitic channel 31 is formed beneath the first gate insulating layer 11, but the parasitic channel 31 is electrically insulated from the P-type substrate 10 by the depletion layer 30a caused by the impurity diffused region 22 for reducing the substrate current, so the parasitic channel 31 is never connected to the substrate 10.

Therefore, holes which are formed near the source region 20 are prevented from moving to the substrate 10, so it is possible to extract electrons from the floating gate 12 without a large current.

According to the semiconductor device of the present invention, a large substrate current will not occur when extracting electrons from the floating gate 12 in contrast to the conventional method. Therefore, a normal high voltage used when extracting electrons can be fully applied by a step-up transformer in a circuit, so a separate high-voltage high-current power source, which is needed as well as a normal power source in the related art, is no longer required. In addition, holes accumulate at the parasitic channel 31, so the first gate insulating layer 11 is efficiently supplied with voltage, the efficiency of discharging electrons is improved, and the time for extracting electrons can be shortened or the voltage for extracting electrons can be reduced.

The above explanation was made with reference to moving electrons to a source region, but exactly the same applies to a drain region. Further, the invention is effective for a P-type channel flash EEPROM semiconductor memory as well. In the case of a P-type channel type, however, electrons are injected from a source region or a drain region to a floating gate instead of being extracted.

Figure 3:
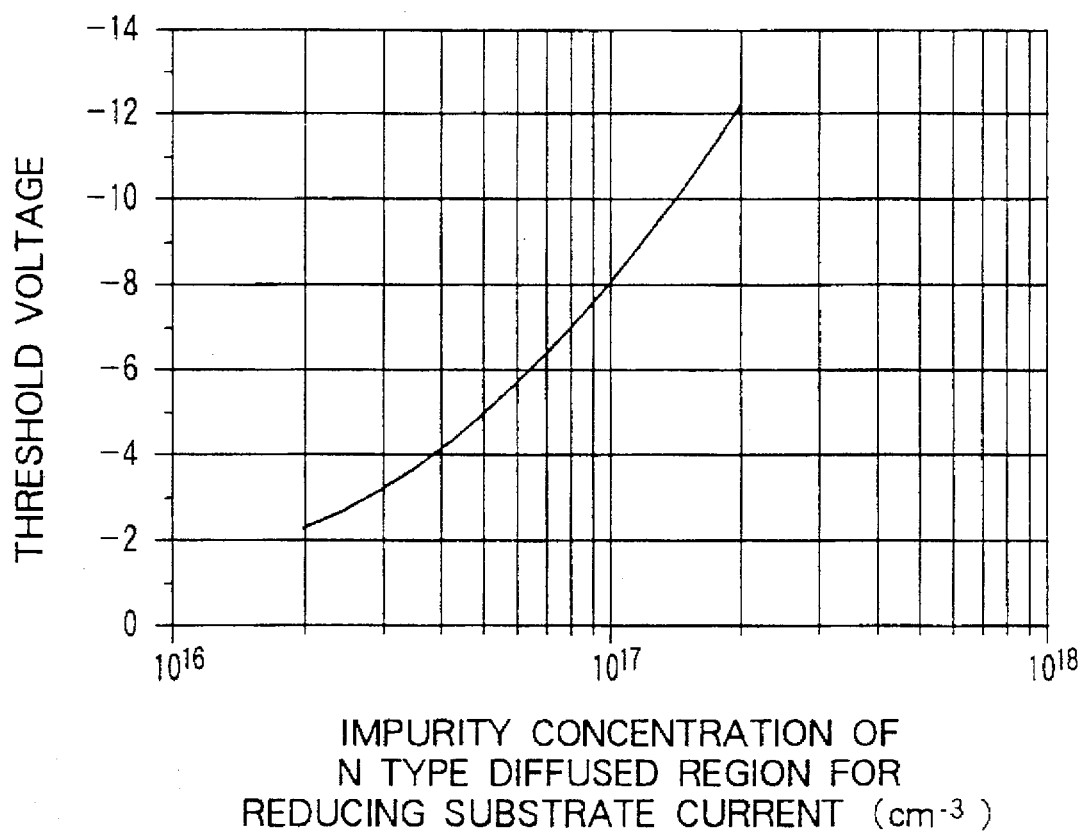
FIG. 3 is a graph showing the change of the threshold voltage of the semiconductor device in relation to the impurity concentration of the N-type region for reducing the substrate current.

The formation of an N-type region beneath the first gate insulating layer 11 gives the transistor a minus threshold voltage as shown in FIG. 3. The transistor becomes a depletion mode. Therefore, another method for writing or reading is needed in contrast to a conventional flash EEPROM such as a DINOR type which assumes an enhancement mode. There are many solutions to this problem. For example, it is possible to first inject into a floating gate an equivalent amount of electrons as the threshold voltage for the impurity concentration of the impurity diffused layer for controlling the substrate current as shown in FIG. 3. AS a result, the threshold voltage is shifted to a plus volt, thereby solving the problem.

The process of producing the semiconductor memory device of the present invention will be described next. In this explanation, the method of making the N-channel type flash EEPROM semiconductor device shown in FIG. 2A will be used as an example. The semiconductor memory device of the present invention can be produced by the same process as the process of a conventional N-channel type flash EEPROM semiconductor device except for forming the impurity diffused layer 22 for reducing the substrate current.

Figure 4A:
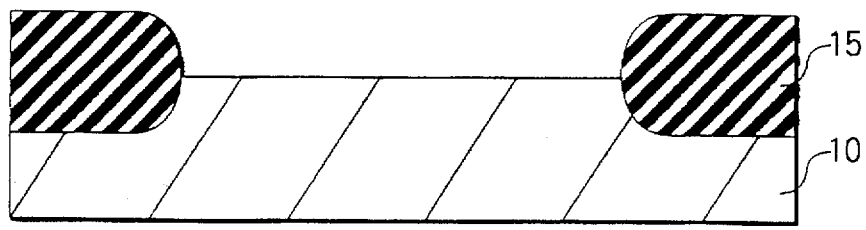
FIGS. 4A to 4D are sectional views of successive stages of manufacturing the flash EEPROM of the present invention.

First, as shown in FIG. 4A, a silicon oxide layer 15 of a thickness of about 500 nm is formed on the surface of a P-type silicon substrate 10 by a standard LOCOS process.

Figure 4B:
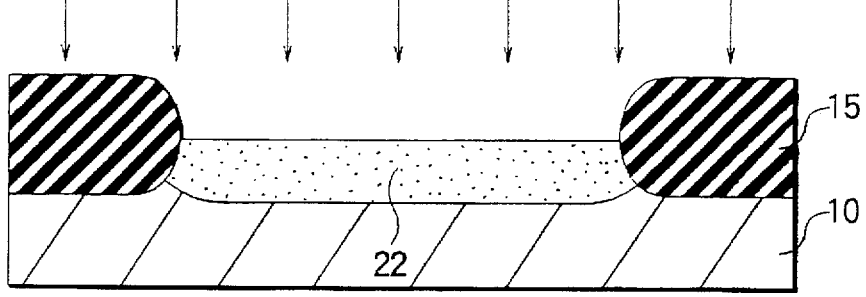

Next, an impurity diffused layer 22 for controling the substrate current is formed by ion implantation as shown in FIG. 4B. The conditions of the implantation are an ion source of arsenic ions, an energy of 20 kev, and a dosage of about $1\times10^{13}/cm^{-2}$. At this time, the impurity concentration of the impurity diffused layer 22 is about $1\times 10^{17}$ cm$^{-3}$. The impurity concentration of the impurity diffused layer 22 is preferably lower than that of the source or a drain region due to its functions, for example, is $1\times10^{16}$ to $1\times10^{18}$ cm$^{-3}$, more preferably $1\times10^{16}$ to $1\times10^{17}$ cm$^{-3}$.

Figure 4C:
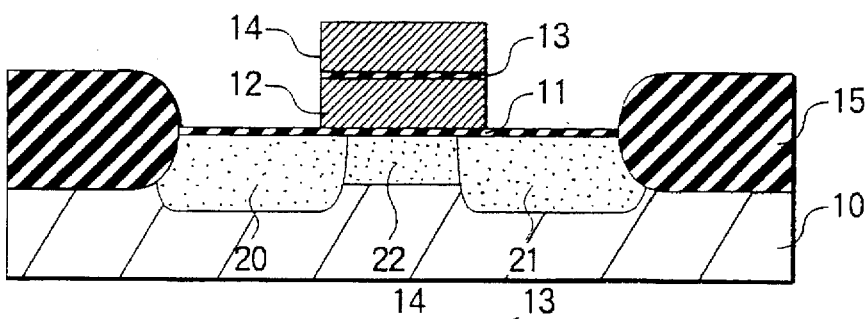

Next, as shown in FIG. 4C, a first gate insulating layer 11 of a thickness of about 10 nm is formed by a standard thermal oxidation, then a first polycrystalline silicon layer of a thickness of about 100 nm is formed by a standard CVD deposition method and patterned. A second gate insulating layer 13 of a thickness of 20 nm composed of an ONO layer (three successive layers of silicon oxide, silicon nitride, and silicon oxide) is formed. Next, a second polycrystalline silicon layer of a thickness of about 100 nm is deposited by a CVD method, then a control gate 14 is created by patterning that layer by a standard method. Ion implantation is then performed to create source and drain regions using arsenic ions, an energy of about 50 kev, and a dosage of about $1\times10^{14}$ cm$^{-2}$. The impurity concentration of the source and drain regions is $1\times10^{17}$ cm$^{-3}$.

Figure 4D:
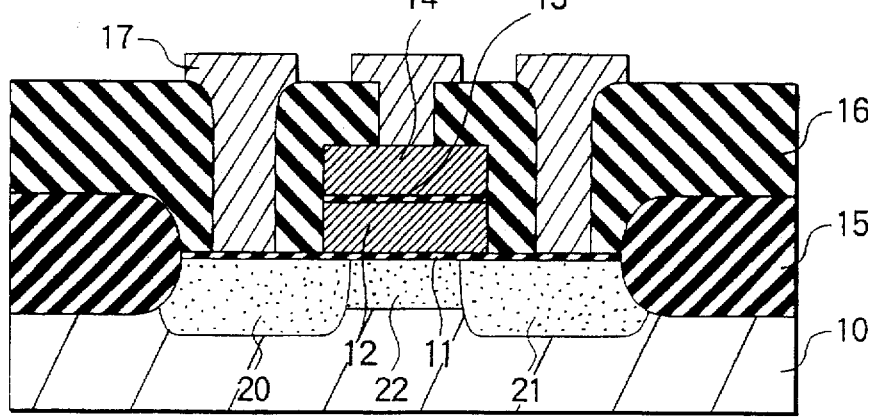

Next, as shown in FIG. 4D, a silicon oxide layer 16 of a thickness of about 400 nm is deposited as an insulating layer. Next, contact holes are formed through the silicon oxide 16 and aluminum interconnections 17 are created. This completes the N-type channel flash EEPROM of the present invention.

While this invention has been described with reference to illustrative embodiments, this description is not intended to be construed in a limiting sense. Various modification of the illustrative embodiments, such as another semiconductor memory device other than an N-type channel flash EEPROM as described are covered within the true scope of the invention.

What is claimed is:

1. A nonvolatile semiconductor memory device having a plurality of memory cells, each of said memory cells comprising:

a semiconductor substrate having a first conductivity type;

a first impurity region having a second conductivity type;

a second impurity region having the second conductivity type, said first and second impurity regions being formed separated from each other in a surface area of the semiconductor substrate;

a channel region formed between said first and second impurity regions in the surface area of and substantially adjacent to the semiconductor substrate;

a floating gate electrode formed on said channel region via a tunneling insulation layer; and a control gate electrode formed on said floating gate electrode via a dielectric layer;

said channel region having formed in it an impurity diffused layer having the second conductivity type to thereby reduce a leakage current flowing between said first impurity region and the semiconductor substrate when extracting electrons from the floating gate and the leakage current between the second impurity region and the semiconductor substrate when injecting electrons to the floating gate, wherein said surface area in which said channel region is located lies substantially adjacent to said substrate without an intervening layer.

2. A nonvolatile semiconductor memory device according to claim 1, wherein the impurity concentration of said impurity diffused layer is lower than that of said first and second impurity regions.

3. A nonvolatile semiconductor memory device according to claim 2, wherein the impurity concentration of said impurity diffused layer is from $1\times10^{16}$ cm$^{-3}$ to $1\times10^{18}$ cm$^{-3}$.

4. A nonvolatile semiconductor memory device according to claim 1, wherein an injection of electrons to the floating gate and an extraction of electrons from the floating gate are performed by the tunneling current.

5. In a nonvolatile semiconductor memory device having a plurality of memory cells, each of the memory cells comprising:

a semiconductor substrate having a first conductivity type;

a first region formed beneath a surface of the semiconductor substrate, said first region having a second conductivity type different from said first conductivity type and acting as either a source region or a drain region;

a second region formed beneath the surface of the semiconductor substrate and spaced from said first region, said second region having a second conductivity type different from said first conductivity type and acting as a source region or a drain region opposite that of said first region;

a first gate insulating layer formed on the surface of said substrate;

a floating gate formed on the first gate insulating layer;

a second insulating layer formed on the floating gate;

a control gate formed on the insulating layer; and means for extracting electrons from the floating gate when the first conductivity type is a p-type and the second conductivity type is an n-type for injecting electrons to the floating gate when the first conductivity type is an n-type and the second conductivity type is a p-type by applying a voltage between the control gate and the source region to provide an electric voltage to the first gate insulating layer sufficient to move electrons from or to the floating gate to or from the source region by a tunneling phenomenon, but resulting in a band-to-band current flowing between the source region and the substrate and resulting in a depletion layer and a parasitic channel formed near a boundary between the source region and the substrate under the first gate insulating layer;

the improvement comprising:

means, including an impurity diffused region under the first gate insulating layer inside the surface of the semiconductor substrate and having a same second conductivity type as said source region and said drain region, for reducing substrate current and functioning as a defense region against leakage current to the substrate by connecting the source region and the drain region by the diffused region.

6. A nonvolatile semiconductor memory device according to claim 5, wherein the impurity concentration of said impurity diffused region is lower than that of said first and second impurity regions.

7. A nonvolatile semiconductor memory device according to claim 6, wherein the impurity concentration of said impurity diffused region is from $1\times10^{16}$ cm$^{-3}$ to $1\times10^{18}$ cm$^{-3}$.

8. A nonvolatile semiconductor memory device according to claim 5, wherein the injection of electrons to the floating gate and the extraction of electrons from the floating gate are performed by the tunneling current.

9. A flash EEPROM, comprising:

a P-type substrate having a surface;

a first gate insulating layer located on said surface of said P-type substrate;

a floating gate;

a second insulating layer;

a control gate, said floating gate, said second insulating layer, and said control gate successively constructed in order on the surface of said P-type substrate via said first insulating layer;

an N-type source region;

an N-type drain region, said source region and said drain region formed beneath said surface of said substrate;

means for extracting electrons from the floating gate, wherein a band-to-band current flows between the source region and the substrate; and means, including an N-type impurity diffused region having an N-type conductivity located under the first gate insulating layer inside the surface of the P-type substrate and substantially adjacent thereto and connecting the source region and the drain region by the N-type diffused region, for reducing substrate current and functioning as a defense region against leakage current to the substrate.

10. The flash EEPROM, as set forth in claim 9, wherein said extracting means includes means for applying a voltage to the control gate through a control electrode, means for applying a voltage to the source region through a source electrode, and means for applying a voltage to the drain region through a drain electrode, wherein a depletion layer is formed under the first gate insulating layer which is caused by the impurity diffused region.

11. The flash EEPROM, as set forth in claim 10, wherein said extracting means forms a problematical parasitic channel beneath the first gate insulating layer which is electrically insulated from the P-type substrate by the depletion layer for reducing the substrate current.

12. The flash EEPROM, as set forth in claim 11, wherein said extracting means prevent holes which are formed near the source region from moving to the substrate, sothat electrons are extracted from the floating gate.

* * * * *